US006960912B2

(12) United States Patent
Beichler et al.

(10) Patent No.: US 6,960,912 B2
(45) Date of Patent: Nov. 1, 2005

(54) MAGNETIC FIELD SENSOR DEVICE

(75) Inventors: Johannes Beichler, Eppertshausen (DE); Michael Engelstaedter, Hanau (DE); Michael Friedrichs, Bruchköbel (DE); Claude Goethals, Hanau (DE); Achim Kipper, Bruchköbel (DE); Markus Settegast, Alzenau (DE)

(73) Assignee: Vacuumschmelze GmbH & Co. KG, (DE)

( * ) Notice: Subject to any disclaimer, the term of this patent is extended or adjusted under 35 U.S.C. 154(b) by 0 days.

(21) Appl. No.: 10/436,678

(22) Filed: May 12, 2003

(65) Prior Publication Data

US 2005/0017714 A1 Jan. 27, 2005

(51) Int. Cl.[7] ........................ G01R 33/02; G01R 33/00
(52) U.S. Cl. ....................... 324/247; 324/244; 324/260
(58) Field of Search ............................... 324/253, 258, 324/249, 247, 244, 207.15, 207.2, 207.21, 324/245, 260, 261; 33/319

(56) References Cited

U.S. PATENT DOCUMENTS

| | | | | |
|---|---|---|---|---|
| 2,597,125 | A * | 5/1952 | Noxon | 33/319 |
| 2,710,942 | A * | 6/1955 | Emerson | 324/247 |
| 2,852,859 | A | 9/1958 | Depp | |
| 3,133,244 | A * | 5/1964 | Wojtulewicz | 324/247 |
| 3,564,402 | A * | 2/1971 | Ishida et al. | 324/247 |
| 3,573,610 | A * | 4/1971 | Kesselring | 324/247 |
| 3,873,913 | A * | 3/1975 | Obenschain | 324/262 |
| 3,881,258 | A * | 5/1975 | Iddings | 33/357 |
| 3,961,245 | A * | 6/1976 | Schonstedt | 324/245 |
| 4,194,150 | A * | 3/1980 | Obenschain | 324/245 |
| 4,739,263 | A | 4/1988 | Mohri et al. | |
| 5,414,355 | A * | 5/1995 | Davidson et al. | 324/207.2 |
| 6,504,366 | B2 * | 1/2003 | Bodin et al. | 324/247 |
| 6,564,158 | B1 * | 5/2003 | Rabel et al. | 702/57 |
| 2002/0093331 | A1 * | 7/2002 | Rochelle | 324/247 |

FOREIGN PATENT DOCUMENTS

| | | |
|---|---|---|
| EP | 1037304 | 9/2000 |

* cited by examiner

*Primary Examiner*—Bot Ledynh
(74) *Attorney, Agent, or Firm*—Dean W. Russell; Kilpatrick Stockton LLP

(57) ABSTRACT

In a magnetic sensor device, a positioning element is provided with receptacles for receiving one magnetic field sensor element each. The positioning element and the magnetic field sensor elements are manufactured in a way that they fit exactly together so that the positioning element exactly positions the sensor elements with respect to each other. The magnetic field sensor elements may be manufactured separately before they are put together to build the magnetic field sensor device.

11 Claims, 4 Drawing Sheets

MAGNETIC FIELD SENSOR DEVICE

BACKGROUND OF THE INVENTION

The present invention relates generally to devices for determining the direction of the earth's magnetic field, e.g. to magnetic compass devices. Such devices are used for finding the direction of the earth's magnetism at a particular point on the earth's surface or in the air. The output of such sensors may not only be used for finding the direction of the magnetic field but also, by reference to a known distribution of the earth's magnetic field in all three dimensions, for identifying the location of the sensor on the surface of the earth. Devices as the magnetic field sensor device according to the present invention may serve for automobiles, airplanes or as mobile devices independent of any transportation medium.

FIG. 1 illustrates a known earth's magnetism flux sensor with an O-ring-shaped magnetic core C made of permalloy. On the magnetic core C an exciting coil CD and detection coils CX and CY perpendicular to each other are wound. An oscillator OSC provides a signal having a frequency f to the exciting coil CD. In the detection coils CX and CY a signal is thereby induced wherein the signal is also depending on the horizontal component of the earth's magnetism in parallel to the longitudinal axis of the respective detection coil CX or CY. The outputs of the detection coils are applied to respective synchronous detectors SYNC through respective bandpass filters BPF and respective amplifiers AMP. The synchronous detectors SYNC also receive the reference signal having the frequency 2*f* provided by said oscillator OSC through the frequency doubler DOUBLER and phase controller PHASE CONT. Respective outputs of the circuit EX and EY relate to the direction of the coils CX and CY with respect to the earth's magnetic field.

If the coils CX and CY are positioned horizontally, the horizontal components of the earth's magnetic field are detected.

When the sensor device is rotated about a vertical axis by 360 degrees, the intensity of the earth's magnetic horizontal field components detected by the respective coils CX and CY follows a sinusoidal curve shown in FIG. 2.

Another embodiment of a magnetic field sensor device shown in U.S. Pat. No. 4,739,263 avoids some disadvantages of the device described above as for example the large size and drifts in measurement over a period of time. This is achieved by a device with separate magnetic cores for the distinct directions, where for each direction two coils are located on opposite ends of a single magnetic core. The coils are excited by a signal having a frequency f and a differential level of output of the two coils is measured by an electric circuit, the output being balanced to zero as long as no external magnetic field is present. As soon as the earth's magnetic field component parallel to one of the magnetic coils is present, the respective differential level is out of balance and this imbalance is measured.

This magnetic field sensor device is much more sensitive to magnetic fields than the one described above and less sensitive to drifts.

Additionally, a third sensor element may be provided which is the same as those used for the horizontal components and which is appropriately positioned to detect the vertical component of the earth's magnetic field. According to the prior art, this third sensor element is used to align the other two sensor elements perpendicular to the vertical axis.

From U.S. Pat. No. 2,852,859 a device for determining the direction of the earth's magnetic field in the form of a flux valve is known. This magnetic field detector consists of a sensitive core element in form of a spider of high permeability metal having a generally Y-shaped configuration, the legs or arms of which are preferably arranged 120 degrees apart. Suitable horns of the permeable material are provided for collecting the magnetic lines of the flux and concentrating them in the legs of the spider.

The spider is provided with a centre winding which is excited electrically with an alternating current supply voltage of frequency f which serves cyclically to vary the reluctance of the core material, that is to periodically saturate and unsaturate the core material and thereby effectively open and close the valve to any magnetic field in the vicinity of the valve. Mounted on each leg above the spider is a pick-up or output winding in which is generated a voltage each time the valve is opened and closed by the excitation voltage. Thus the output of each winding will be an alternating voltage proportional in amplitude to the magnitude of the component of the external magnetic field which is arranged substantially collinear to the axis of the respective pick-up coil. The leads of the pick-up coils are connected to an electrical circuit for analysing the measurements.

European Patent Application EP 1037304 A2 discloses a sensor element comprising a magnetic core and a winding, said sensor element preferably serving as an antenna for a car locking and unlocking system which allows remote locking or unlocking of car doors. Said sensor element has a structure that allows for miniaturizing and low cost mass production.

It is an object of the present invention to overcome the disadvantages and limitations of prior art magnetic field sensor devices by providing a new and improved device.

It is also an object of the present invention to provide a magnetic field sensor device which is small in size, light in weight, easy to manufacture, inexpensive and has a high operational reliability.

SUMMARY OF THE INVENTION

The new device also allows for detecting the earth's magnetic field in three dimensions for determining not only the direction but also the position on the surface of the earth where the measurement is carried out.

The above objectives are achieved by a magnetic field sensor device comprising a first magnetic field sensor element with a first sensor element axis wherein said first magnetic field sensor element detects a component of a magnetic field which is parallel to said first sensor element axis; said magnetic field sensor device further comprising a second magnetic field sensor element with a second sensor element axis wherein said second magnetic field sensor element detects a component of a magnetic field which is parallel to said second sensor element axis, wherein said first and second magnetic field sensor elements are fixedly positioned with respect to each other and said first and second magnetic field sensor element axis include an angle greater than 0 and smaller than 180 degrees, said magnetic field sensor device further comprising a positioning element with a first receptacle and a second receptacle whereby said first and second magnetic field sensor elements can be fixedly positioned with respect to each other.

The objectives mentioned above are also achieved by a positioning element for a magnetic field sensor device, comprising a first and a second receptacle for positioning a first and a second magnetic field sensor element with respect to each other in a way that a first magnetic field sensor element axis of said first magnetic field sensor element and said second magnetic field sensor element axis of said second magnetic field sensor element include an angle between zero and 180 degrees.

A method for producing a magnetic field sensor device according to the invention, comprises:

In a first step making a first, a second and, in some cases, a third magnetic field sensor device each comprising a magnetic core and a winding, in a second step fixing said first, second and, in the case of three sensor devices, a third magnetic field sensor devices in a first, second and third receptacle of a positioning element respectively.

Further advantageous embodiments of the invention are illustrated in the drawings and the following description, whereby the scope of the invention is not limited to the examples given.

BRIEF DESCRIPTION OF THE DRAWINGS

The objectives of the invention mentioned above, the features and the achieved advantages of the present invention will be better understood or become clear by means of the following description and the accompanying drawings, wherein.

DETAILED DESCRIPTION

Sensor devices known from prior art have the disadvantage of being not easy to produce and reliable at the same time. For example, the sensor device known from U.S. Pat. No. 2,852,859 has a positioning element in form of a spider where the legs of the spider include well defined angles between them. It is very difficult to fix the windings of the pick-up coils on the legs of the spider in such system.

Figure 1:
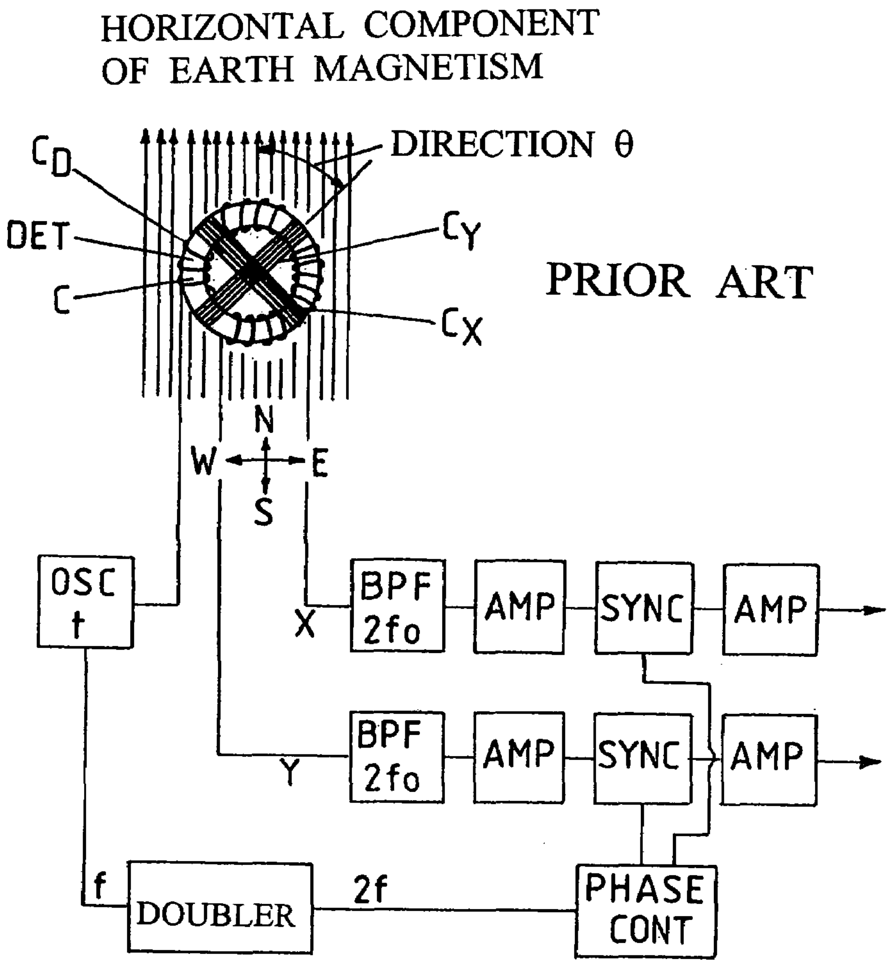
FIG. 1 is a schematic diagram of a prior art direction sensor.
Figure 2:
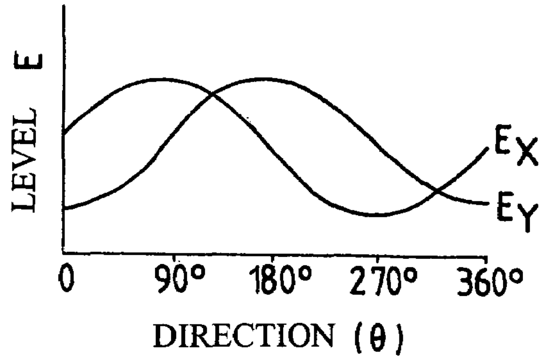
FIG. 2 is a graphical representation showing curves of operation of the apparatus of FIG. 1.
Figure 3:
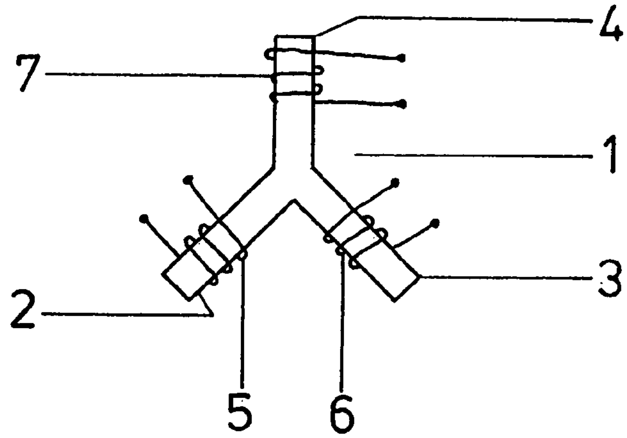
FIG. 3 is a structure with a Y-shaped magnetic core body with windings on each of its legs.

The underlying manufacturing method is not appropriate for low cost mass production. On the other hand, the devices as for example shown in FIG. 1 have pick-up coils that may be made separately wherein it is very difficult to position the different pick-up windings with respect to each other in a well defined and stable angle. This requires a highly sophisticated manufacturing process where the position of the different sensor elements is adjusted. Otherwise, not achieving the required accuracy results in a remarkable deviation between the determined direction of the magnetic field and the true direction. FIG. 3 shows schematically a Y-shaped magnetic core made from permeable metal alloy 1 with three legs 2, 3, 4 and a pick-up winding 5, 6, 7 wound around each of its legs. This structure is similar to that described in U.S. Pat. No. 2,852,859 to which is made reference.

Figure 4:
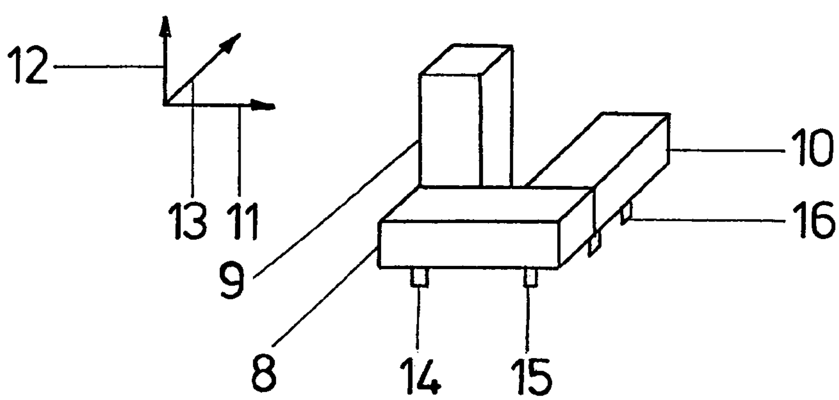
FIG. 4 is a system of sensors comprising three discrete sensor elements put together to form a sensor device.

FIG. 4 shows schematically three magnetic field sensor elements 8, 9, 10, each of which are adapted and appropriately positioned to detect a magnetic field component in one of the three directions 11, 12, 13 of the coordinate system of reference. The single field sensor elements 8, 9, 10 are fixed by pins 14, 15, 16 to a ground plate thereby securing a certain position relative to each other. This requires a relatively complicated manufacturing method and also requires much space on a ground plate that can not be used for two-dimensional leads on the surface of the ground plate, which typically is a circuit board. This is a big disadvantage especially for highly miniaturized devices.

Figure 5:
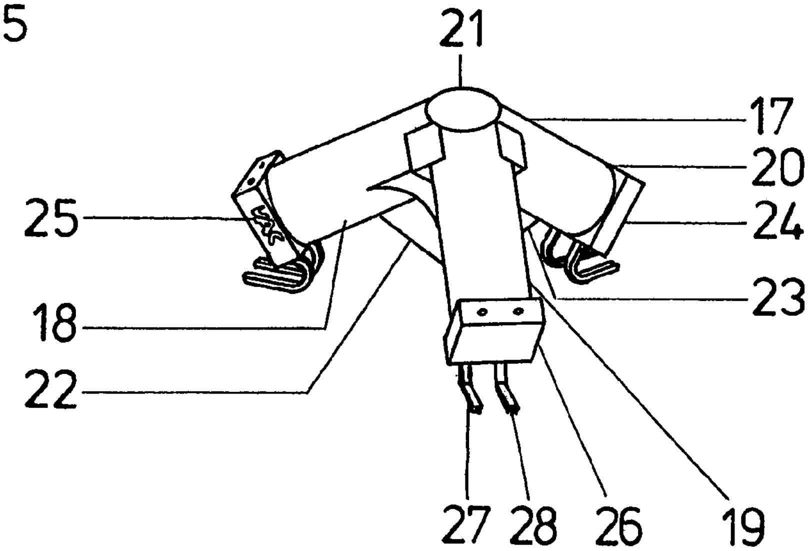
FIG. 5 is a three dimensional view of the sensor device according to the present invention.

FIG. 5 shows a three-dimensional view of the magnetic field sensor device according to the present invention with a positioning element 17 in form of a three-dimensional spider body. The positioning device 17 is produced by moulding and preferably consists of a plastic material that allows easy and cost effective moulding. The positioning element 17 comprises three legs 18, 19, 20 in the form of hollow tubes. The tubes are connected with one another in the centre part 21. Between the tubes 17, 18, 19, plastic ribs 22, 23 are provided for stabilizing the position of the tubes relative to each other. The ribs are also moulded together with the tubes in a single piece.

The three tubes 17, 18, 19 are mutually perpendicular to each other, i.e. between each two of the tubes 17, 18, 19 or more precisely between the respective longitudinal axes of the tubes 17, 18, 19, the magnetic field sensor element axes, an angle of 90 degrees is included. Selecting a 90 degree angle provides a maximum of independency of the measurements of magnetic field components in the three dimensions of space. However, angles different from 90 degrees may also be chosen.

FIG. 5 shows the positioning element 17 with magnetic field sensor elements 24, 25, 26, each of the sensor elements having been pushed into the hollow of one of the tubes 17, 18, 19, the hollow of each tube forming a respective receptacle. The inner diameter of the hollows and the outer diameter of the respective sensor elements are adapted to each other to establish a fitting that permits to fix the sensor elements exactly with respect to position and direction.

It can also be seen from FIG. 5 that each of the magnetic field sensor elements 24, 25, 26 comprises two surface mounting pads 27, 28 each for mounting and electrically connecting the sensor elements on an electrical circuit board. Even though a surface mounting is advantageous, a PIN THROUGH HOLE-technique for fixing the sensor elements is also applicable.

Figure 6:
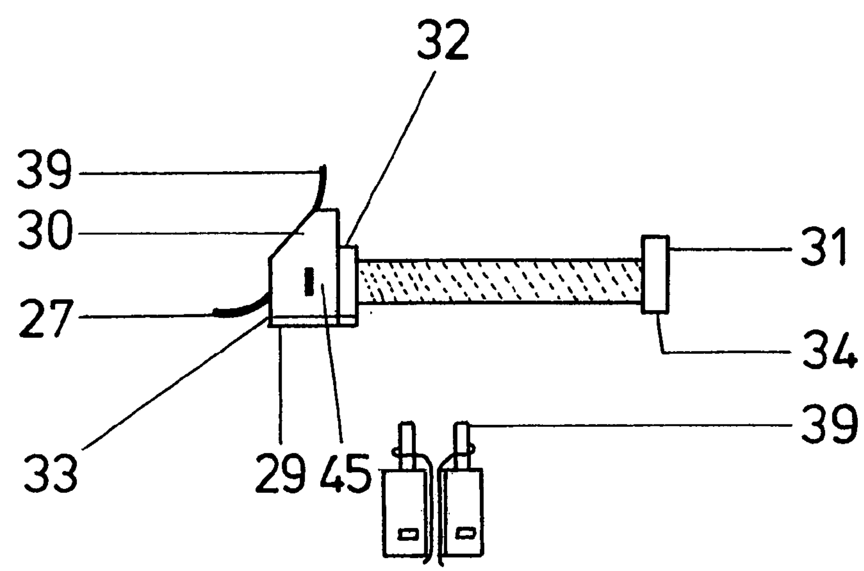
FIG. 6 is a schematic view of a magnetic field sensor element according to the present invention.

In FIG. 6 a magnetic field sensor element is shown in a side view on the upper side of the FIG. and in a front view in the lower part. It is shown, that the sensor element consists of a plastic part 29 with two ends 30, 31 wherein at the first end 30 a cylindrical part 32 and a head part 33 containing the electrical connectors is provided. At the second end 31 of the sensor element, a second cylindrical part 34 of the same diameter as the first cylindrical part 32 is provided, the diameter of the cylindrical parts 32, 34 corresponding to the inner diameter of the tubes 17, 18, 19 of the positioning element. Therefore, the sensor element can be pushed into each of the tubes 17, 18, 19, the cylindrical parts 32, 34 fitting exactly into the hollow of the tube, forming thereby a receptacle for the sensor element which fixes the angular position of the respective sensor element.

Figure 8:
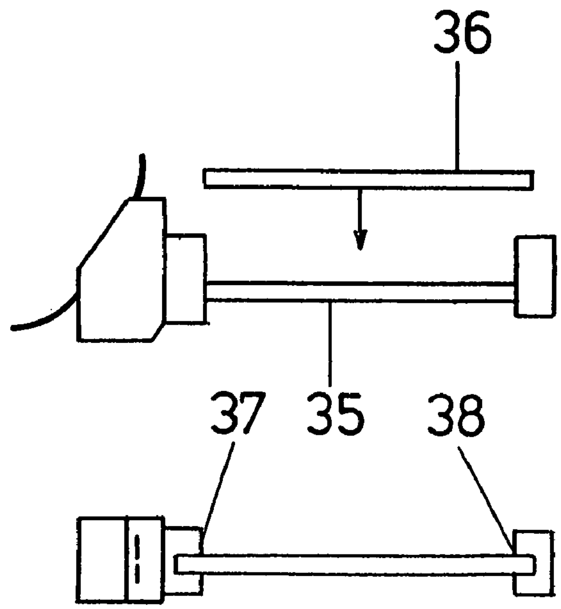
FIG. 8 is a carrier element and a magnetic core element of a magnetic field sensor element used for the present invention.

As is shown in the upper part of FIG. 8, the plastic part of the sensor element also comprises a thin bridge-element 35 connecting the cylindrical parts 32, 34 and serving as a carrier-element for the magnetic core element 36 in form of an amorphous alloy of highly permeable soft magnetic material. The core may also comprise a nanocrystalline material The magnetic core is fixed in slots 37, 38 shown in the bottom part of FIG. 8 in the cylindrical parts 32, 34. While manufacturing the sensor element, the magnetic core element 36 is fixed to the bridge-element 35. Both together form the core of an electrical winding by winding an isolated wire around them, the ends of the winding being connected to the upper ends 39 of the electrical connectors as shown in the bottom part of FIG. 6. The electrical connectors extend through the plastic head part 33 of the sensor element and form the surface mount pads 27, 28 on the end opposed to their ends 39.

Figure 7:
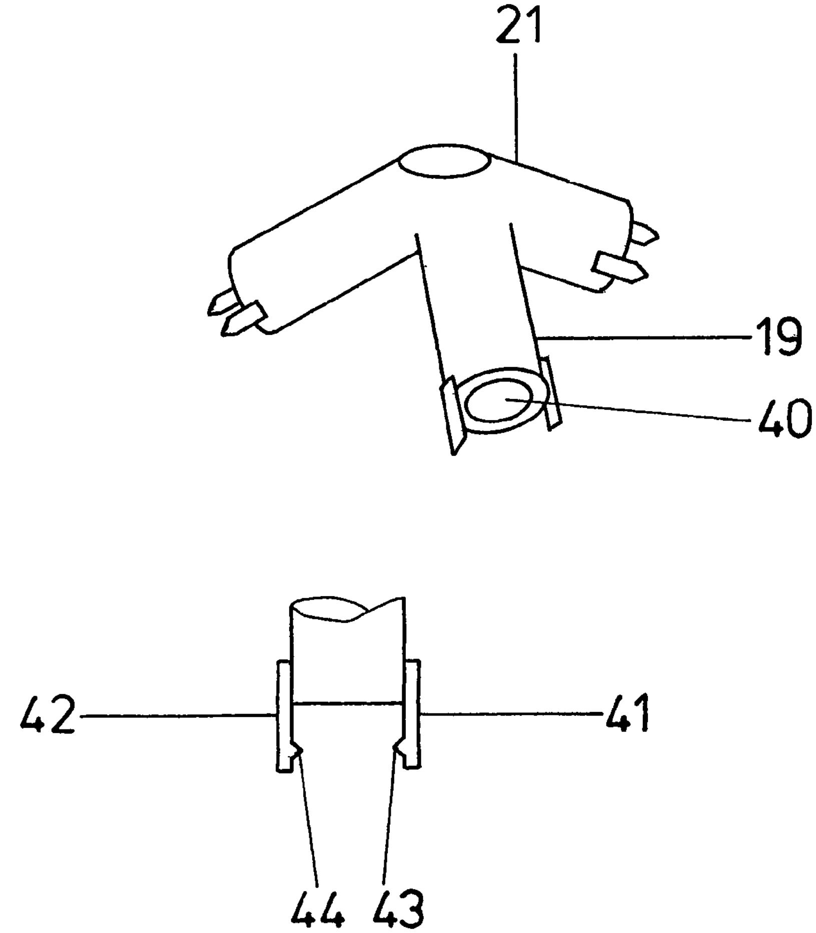
FIG. 7 is the positioning element according to the present invention with one receptacle ready to receive a sensor element.

FIG. 7 illustrates a positioning element 21 without sensor elements. The tubes 19 are open and provide a hollow 40, each of which serves as a receptacle for a respective sensor element. On both sides of each tube 19, elastic stripes 41, 42 integrated into the mould plastic positioning element are provided, wherein the stripes 41, 42 provide noses 43, 44 directed inwardly towards the head part 33 of the respective sensor element that can be positioned in the hollow 40. The head parts of the sensor elements provide on their side faces ribs 45 that form a snap-in mechanism with the noses 43, 44 when the respective sensor element is pushed into a receptacle. Thus, each of the sensor elements is fixed ultimately in the positioning element 21.

Figure 9:
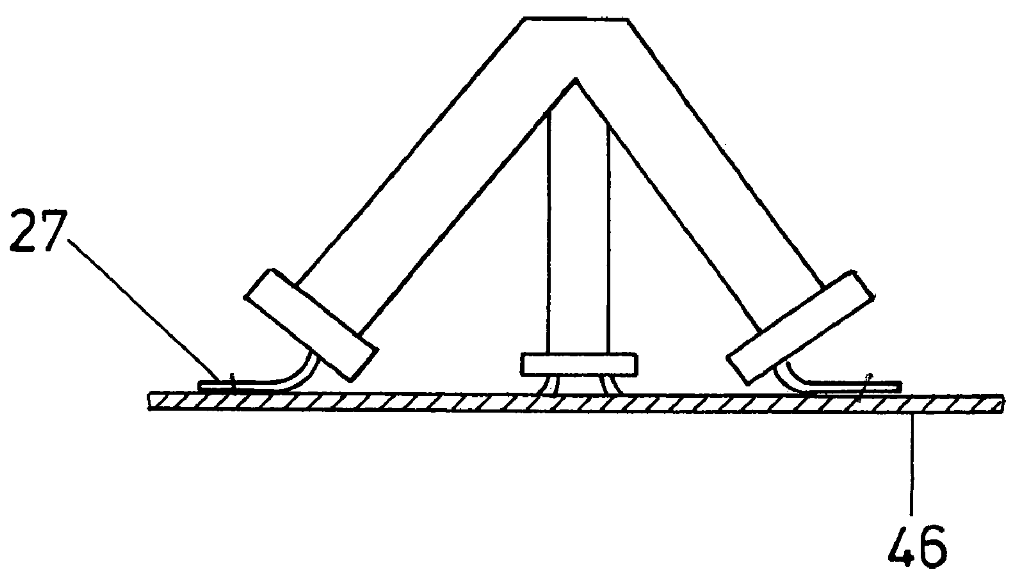
FIG. 9 is a side view of the magnetic field sensor device mounted on a circuit board.

FIG. 9 shows how the positioning element including three respective sensor elements is fixed on a circuit board 46 by soldering the surface mount pads 27, 28 on respective surface contacts of the circuit board 46. Here, a PIN THROUGH HOLE-fixing and contacting would also be applicable, but would require more space on the circuit board and more time for the mounting process.

What is claimed is:

1. Magnetic field sensor device comprising three magnetic field sensor elements each having a sensor element axis, wherein each of said magnetic field sensor elements detects a component of a magnetic field which is parallel to the respective sensor element axis;

said three magnetic field sensor elements are fixedly positioned such that said magnetic field sensor element axes extending in three dimensions form a three dimensional Cartesian coordinate system, wherein said magnetic field sensor elements are joined together at one end and each magnetic field sensor element comprises electrical contacts at the other end.

2. Magnetic field sensor device as claimed in claim 1 comprising a positioning element having three receptacles for fixedly positioning said magnetic field sensor elements with respect to each other.

3. Magnetic field sensor device as claimed in claim 1, wherein said positioning element comprises at least two hollow tubes with respective receptacles for receiving said magnetic field sensor elements.

4. Magnetic field sensor device as claimed in claim 2, wherein said positioning element is formed at least partially of a moulded plastic material.

5. Magnetic field sensor device as claimed in claim 1, wherein each of said magnetic field sensor elements comprises a magnetic core and a winding that is connectable to an electric circuit.

6. Magnetic field sensor device as claimed in claim 5, wherein the magnetic cores comprise nanocrystalline or amorphous magnetic material.

7. Magnetic field sensor device as claimed in claim 5, wherein each of said magnetic field sensor elements comprises a carrier element.

8. Magnetic field sensor device as claimed in claim 7, wherein said carrier element comprises two contacts for contacting the ends of the winding, each of said contacts being adapted to be connected to electrical circuitry.

9. Magnetic field sensor device as claimed in claim 8, wherein the contacts are arranged in a plane, said plane being defined by a circuit board.

10. Magnetic field sensor device as claimed in claim 9, wherein the contacts are mounting pads for surface mounting said pads to the circuit board.

11. Magnetic field sensor device as claimed in claim 9, wherein the contacts are mounting pins for pin-through-hole mounting said pins to the circuit board.

* * * * *